United States Patent [19]

Tsui et al.

[11] Patent Number: 4,963,816
[45] Date of Patent: Oct. 16, 1990

[54] INSTANTANEOUS FREQUENCY MEASUREMENT (IFM) RECEIVER WITH ONLY TWO DELAY LINES

[75] Inventors: James B. Y. Tsui, Centerville; William S. McCormick, Dayton, both of Ohio

[73] Assignee: The United States of America as represented by the Secretary of the Air Force, Washington, D.C.

[21] Appl. No.: 376,274

[22] Filed: Jul. 5, 1989

[51] Int. Cl.⁵ ............................................. G01R 23/16
[52] U.S. Cl. ................................. 324/77 H; 324/77 G
[58] Field of Search ............... 324/77 R, 77 D, 77 E, 324/77 G, 77 H, 79 R, 79 D, 85; 343/16, 18; 455/226; 342/417; 364/715; 375/82; 356/349

[56] References Cited

U.S. PATENT DOCUMENTS

| | | | |
|---|---|---|---|
| 3,939,411 | 2/1976 | James | 324/77 |
| 3,991,365 | 11/1976 | Takeuchi | 324/77 G |
| 4,194,206 | 3/1980 | Tsui et al. | 343/18 |
| 4,200,840 | 4/1980 | Tsui | 455/226 |
| 4,209,835 | 6/1980 | Guadagnolo | 364/715 |
| 4,336,541 | 6/1982 | Tsui et al. | 343/18 |
| 4,414,505 | 11/1983 | Cuckson | 324/85 |
| 4,426,648 | 1/1984 | Tsui et al. | 343/18 |
| 4,532,515 | 7/1985 | Cantrell et al. | 343/16 |
| 4,547,727 | 10/1985 | Tsui et al. | 324/79 |
| 4,633,516 | 12/1986 | Tsui | 455/226 |
| 4,638,319 | 1/1987 | Chua | 342/417 |
| 4,644,267 | 2/1987 | Tsui et al. | 324/77 |
| 4,798,467 | 1/1989 | Wyeth et al. | 356/349 |
| 4,860,318 | 8/1989 | Shaw et al. | 375/82 |

Primary Examiner—Michael J. Tokar
Attorney, Agent, or Firm—Bernard E. Franz; Donald J. Singer

[57] ABSTRACT

The IFM receiver employs only two delay lines, thereby simplifying the IFM receiver design. The basic principle is to use two delay lines to provide fine frequency resolution, and at the same time cover a wide input bandwidth. The two delay line lengths must be relatively prime. The algorithm for achieving frequency resolution is based on the Chinese remainder theorem. That theorem states that if an unknown number X is divided by a with a remainder $r_1$ and also divided by b with a remainder $r_2$, where a and b are relatively prime numbers, the number X can be determined from a, b, $r_1$, and $r_2$ is X<ab.

3 Claims, 2 Drawing Sheets

INSTANTANEOUS FREQUENCY MEASUREMENT (IFM) RECEIVER WITH ONLY TWO DELAY LINES

RIGHTS OF THE GOVERNMENT

The invention described herein may be manufactured and used by or for the Government of the United States for all governmental purposes without the payment of any royalty.

BACKGROUND OF THE INVENTION

The present invention relates generally to an instantaneous frequency measurement (IFM) receiver.

In an IFM receiver, delay lines and correlators are used to measure the frequency of input signals. If the delay time is $\tau$, and the angular frequency of the input signal is $\omega$ ($=2\pi f$), the outputs of the correlators are sin $\omega\tau$ and cos $\omega\tau$. An IFM receiver has a wide input bandwidth with fine frequency resolution. The conventional approach to achieve such a design is to use multiple delay lines. A very common relation among the delay lines is $\tau$, $2\tau$, $4\tau$, $8\tau$, $16\tau$, $32\tau$, and $64\tau$ where $\tau$ represents the shortest delay line. In the above design, there are a total of seven delay lines. The short delay lines are used to resolve ambiguity. The shortest delay line must satisfy $\delta\omega\tau < 2\pi$ where $\delta\omega$ is the bandwidth of the receiver. The longest delay line is used to produce the fine frequency resolution.

United States patents by applicant James B. Y. Tsui sole or et al for IFM and other EW receivers include (1) U.S. Pat. No. 4,194,206 issued Mar. 18, 1980 for an Instantaneous Frequency Measurement (IFM) Receiver With Capability to separate CW and pulsed Signals; (2) U.S. Pat. No. 4,336,541 issued Jun. 22, 1982 for Simultaneous Signal Detector for an Instantaneous Frequency Measurement Receiver; (3) U.S. Pat. No. 4,426,648 issued Jan. 17, 1984 for Simultaneous Signal Detection for an IFM Receivers by Detecting Intermodulation Products; (4) U.S. Pat. No. 4,547,727 issued Oct. 15, 1985 for Simultaneous Signal Detection for IFM Receivers by Transient Detection; (5) U.S. Pat. No. 4,633,516 issued Dec. 30, 1986 for an Instantaneous Frequency Measurement Receiver With Digital Processing; (6) U.S. Pat. No. 4,200,840 issued Apr. 29, 1980 for a Dual Detection Scheme for Compressive Receivers; and (7) U.S. Pat. No. 4,644,267 issued Feb. 17, 1987 for a Signal Analysis Receiver With Acousto-Optic Delay Lines. There is also an application (by Shaw, Tsui & Hedge) Ser. No. 07/215,662 filed July 6, 1988, for PSK Detection Using an IFM Receiver. These patents and application are hereby incorporated by reference.

Other U.S. patents of interest are U.S. Pat. No. 3,939,411 to James, which teaches an IFM system capable of measuring pulse signals of differing frequencies emitted by a single source. U.S. Pat. No. 4,532,515 to Cantrell et al teaches a device for measuring AOA by converting received echos to complex numbers representing the amplitude and phase. U.S. Pat. No. 4,638,319 to Chua teaches a RF system wherein a phase comparison means provides a signal output and bearing angle.

SUMMARY OF THE INVENTION

An objective of the invention is to simplify the design of an IFM receiver.

The invention relates to an IFM receiver which employs only two delay lines, thereby simplifying the IFM receiver design. The basic principle is to use two delay lines to provide fine frequency resolution and at the same time cover a wide input bandwidth. The two delay line lengths must be relatively prime. The algorithms for achieving frequency resolution is based on the Chinese remainder theorem. That theorem states that if an unknown number X is divided by a with a remainder $r_1$ and also divided by b with a remainder $r_2$, where a and b are relatively prime numbers, the number X can be determined from a, b, $r_1$, and $r_2$ if $X < ab$.

DETAILED DESCRIPTION

Figure 1:
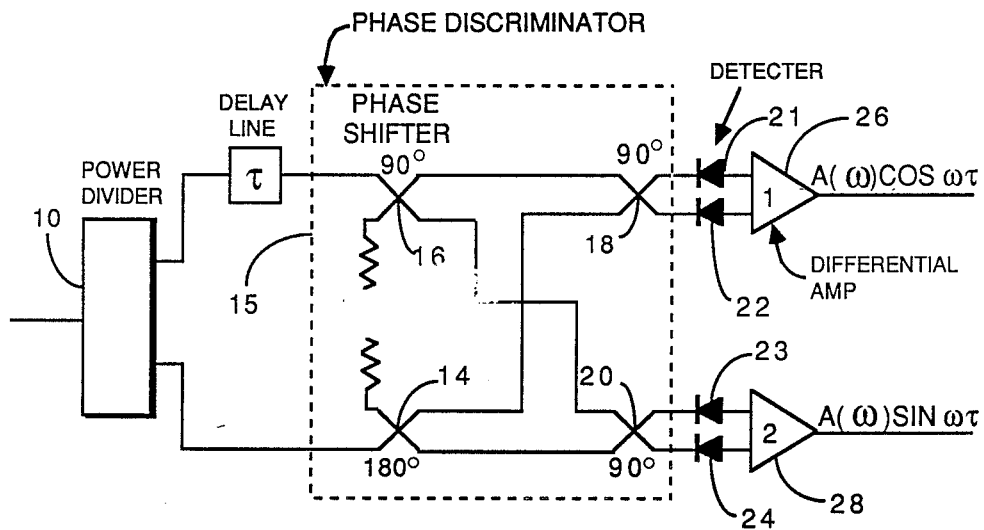
FIG. 1 is a schematic and functional block diagram showing an IFM correlator.

The frequency measurement principle of an IFM receiver is well known. The schematic of an IFM correlator of a basic IFM receiver is shown in FIG. 1. It comprises a power divider 10, one delay line 12, a phase discriminator 15, four detectors 21-24, and two differential amplifiers 26 and 28 used as comparators. The phase discriminator 15 comprises one sum-difference phase shifter (hybrid) 14, and three quadrature phase shifters (hybrids) 16, 18 & 20. After the signal passes through the network, sin $\omega\tau$ and cos $\omega\tau$ are presented at the outputs of the differential amplifiers 26 and 28. By comparing sin $\omega\tau$ and cos $\omega\tau$, the frequency of the input signal can be determined. The comparison occurs only for a very short time period and only after the frequency measurement circuit reaches a stable state. In most receivers the measurement circuit is stable and sampling occurs 50 to 100 nanoseconds after signal detection.

It should be noted that the circuit described above only describes the principle of the IFM receiver. A useful implementation of this principle involves circuits of the type shown in FIG. 1 with different time delays, as shown for example in FIG. 1a of the patent application (by Shaw, Tsui & Hedge) Ser. No. 07/215,662 filed July 6, 1988, for PSK Detection Using an IFM Receiver. An IFM receiver has a wide input bandwidth with fine frequency resolution. The conventional approach to achieve such a design is to use multiple delay lines. A very common relation among the delay lines is $\tau$, $2\tau$, $4\tau$, $8\tau$, $16\tau$, $32\tau$, and $64\tau$ where $\tau$ represents the shortest delay line. In the above design, there are a total of seven delay lines. The short delay lines are used to resolve ambiguity. The shortest delay line must satisfy $\delta\omega\tau < 2\pi$ where $\delta\omega$ is the bandwidth of the receiver. The longest delay line is used to produce the fine frequency resolution.

Figure 2:
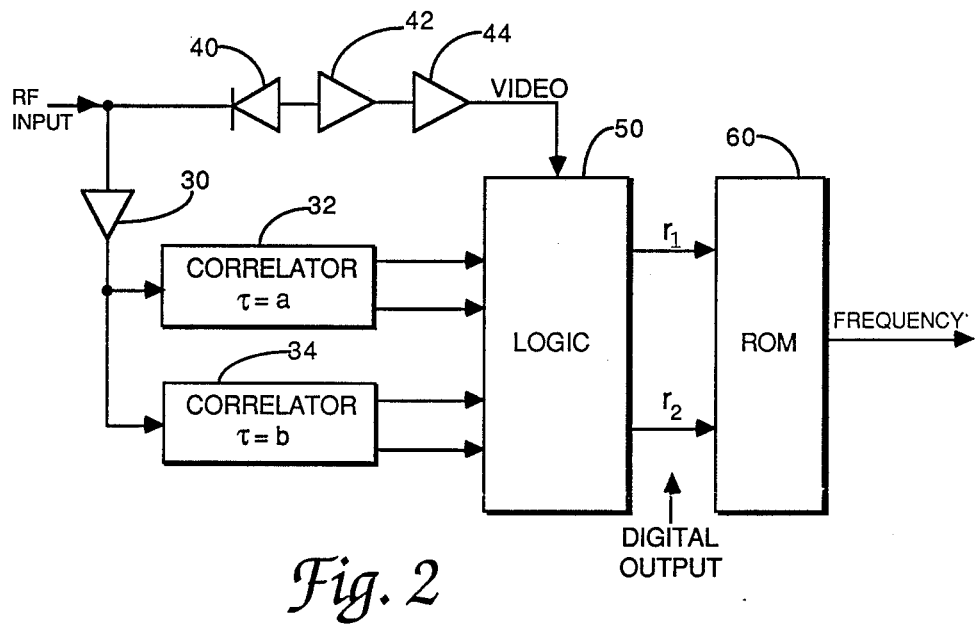
FIG. 2 is a block diagram of an IFM receiver according to the invention.

The IFM receiver shown in FIG. 2 herein corresponds to that shown in FIG. 1a of said pending application, except that only two correlators 32 and 34 are used. In both cases, the RF input is coupled via an amplifier 30 to the inputs of all of the correlators. The two outputs of each correlator go to a logic circuit 50. The receiver also has a video section comprising a detector 40, an amplifier 42, and a comparator 44 providing a video output to the logic circuit 50.

The approach according to the invention provides an IFM receiver which uses fewer delay lines to simplify the design. The basic idea is to use only two delay lines to provide fine frequency resolution, and at the same time cover a wide input bandwidth. The two delay line lengths must be relatively prime. The algorithm is based on a mathematical theorem called the Chinese remainder theorem. The theorem states that if an unknown number x is divided by a number a with a remainder $r_1$ and also divided by a number b with a remainder $r_2$, where a and b are relatively prime numbers, the number x can be determined uniquely from a, b, $r_1$, and $r_2$ if x<ab. For example, if a=5, b=7, $r_1$=2 and $r_2$=1, the Chinese remainder gives an x of 22.

The Chinese remainder theorem can be used in IFM receiver design, as shown in FIG. 2, using only two correlators 32 and 34 of the type shown in FIG. 1, Each correlator includes one delay line 12, having a length $\tau$=a for correlator 32, and a length $\tau$=b for correlator 34. If the two delay lines have relatively prime delay times a and b the remainders can be represented by $$r_1 = \omega a - m \cdot 2\pi \qquad (1)$$

$$r_2 = \omega b - n \cdot 2\pi \qquad (2)$$

where $\omega$ is the input angular signal frequency of the input signal ($\omega=2\pi f$), m and n are unknown integers, and $r_1$ and $r_2$ are less than $2\pi$. Theoretically, the IFM receiver measures $r_1$ and $r_2$. Since a and b are the known delay line lengths, the frequency $\omega$ can be found.

The Chinese remainder theorem must be modified for the IFM receiver application, since the measured remainders $r_1$ and $r_2$ can contain errors caused by noise. The modification of the Chinese remainder theorem involves introducing noise resistance to the algorithm in a manner similar to that to that of error correcting codes in communication theory.

In an IFM receiver, the usually given condition is the desired frequency resolution $\delta f$. From this requirement, the proposed design can find the lengths of the two delay lines, and the unambiguous bandwidth. For a given amount of error protection, it is reasonable to assume that a 6-bit analog-to-digital converter is used to digitize the output of a correlator. The delay length, with the desired frequency resolution, can be written as $$\delta f = \frac{\delta f_a}{2^6} = \frac{\delta f_a}{64} \qquad (3)$$

where $$a = \frac{1}{\delta f_a} = \frac{1}{64 \delta f} \qquad (4)$$

The above equation determines the line length a of the correlator 32. If the error is $l\delta f$, one of the methods to determine the second delay line length will be $$b < (360 - 2 \cdot l\delta f) \frac{a}{360} \qquad (5)$$

which assures that each delay line supplies independent information. If this inequality is violated, the discrimination provided by the two remainders (chinese remainder theorem) can be erroneous. The two delay lines must be relatively prime. In general the closer the b to the equal sign, the wider the unambiguous bandwidth, but the more sensitive is the receiver to noise. The decrease in bandwidth with noise protection represents a bandwidth-noise trade off.

The unambiguous bandwidth is given by $$\delta \omega = \left( \frac{\delta f_a}{4 \cdot l\delta f} \right)(\delta f_a) = \frac{(\delta f_a)^2}{4 \cdot l\delta f} \qquad (6)$$

which is based on the fact that there can be only $\delta f_a/(4 \cdot l\delta f)$ repetitions of the $\delta f_a$ interval before the condition of Equation (5) is violated.

In actual receiver design, this information will be stored in read only memory (ROM). For every $r_1$ and $r_2$ obtained, the correct frequency will be generated from the ROM look up table.

Let us use an example to demonstrate the applications of the above equations. If $\delta f = 1.25$ MHz then $\delta f_a = 64 \times 1.25 = 80$ MHz $a = 1/(80 \times 10^6) = 12.5$ ns If $l = \pm 2\delta f = \pm 2.5$ MHz $b = (360 - 4 \times 1.25) \times 12.5/360 = 12.3$ ns (or say 12 ns)

The unambiguous frequency range will be $$\delta \omega = \frac{(80)^2}{4 \times 2 \times 1.25} = \frac{6400}{10} = 640 \text{ MHz}$$

The addition of the read only memory (ROM) 60 to the receiver is shown in FIG. 2. The logic 50 determines the values of $r_1$ and $r_2$ and provides them in digital form for use as an address for the look-up table in memory 60. The logic 50 takes the sin $\omega\tau$ and cos $\omega\tau$ analog signals from each of the correlators 32 and 34, forms a ratio to obtain the tangent, and then performs an arctangent operation to determine the angular frequency value $\omega$. Note that this process cannot determine from a single correlator whether there are any multiples of $2\pi$, and only a remainder having a value of less that $2\pi$ will be obtained. Therefore in the prior art several correlators were used to resolve the ambiguity but by using the Chinese remainder theorem only two correlators are required.

Figure 3:
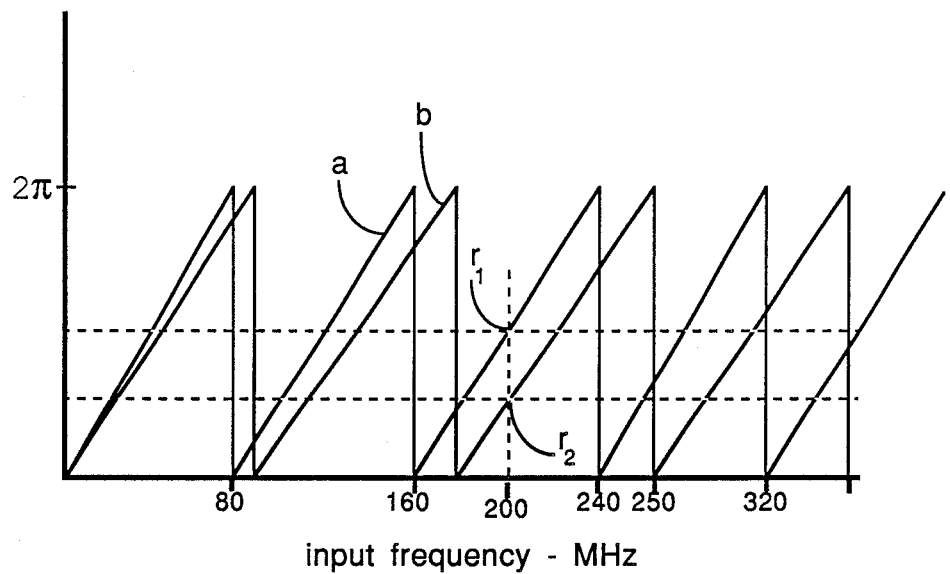
FIG. 3 is a graph of phase versus frequency of two delay lines.
Figure 4:
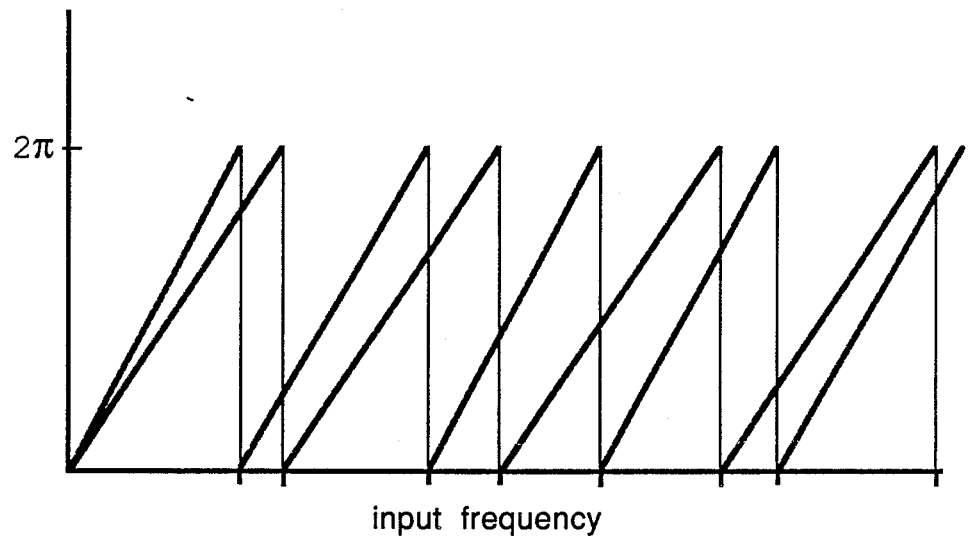
FIG. 4 is a graph of phase versus frequency of two delay lines with noise.

FIG. 3 is a graph which shows the phase versus frequency of two delay lines. FIG. 4 is a graph which shows the phase versus frequency of two delay lines with noise. The separation between the two lines must be wide enough to accomodate the noise The frequencies indicated on FIG. 3 are for the example in which the delay time a is 12.5 nanoseconds for the correlator 32 having the longer delay line, and the delay time b is 12.0 nanoseconds for the correlator 34. Assuming a pulse measurement with the phase values $r_1$ and $r_2$ as shown on FIG. 3, the memory 60 would be programmed to give an output frequency of 200 MHz.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An IFM receiver having a plurality of correlators, with an individual delay line in each correlator, means coupling an RF signal source to each correlator, each correlator having phase discrimination means, detector means and differential amplifier means to provide output signals proportional to sin $\omega\tau$ and cos $\omega\tau$, $\omega$ being an angular frequency of an RF signal from the RF signal source, and logic means using said output signals to derive a phase value for each correlator, the phase value being a remainder less than $2\pi$ for $\omega$, any multiples of $2\pi$ being lost so that there is an ambiguity in the value which is resolved by comparing the outputs of the plurality of correlators;

the improvement in which there are two correlators and therefore two delay lines, said two delay lines having lengths a and b respectively which are relatively prime, said logic means provides respective remainder phase values $r_1$ and $r_2$ less that $2\pi$ for the two correlators, and frequency-determining means for finding the frequency of an RF signal using the equations $$r_1 = \omega a - m \cdot 2\pi \tag{1}$$

$$r_2 = \omega b - n \cdot 2\pi \tag{2}$$

where m and n are unknown integers.

2. An IFM receiver according to claim 1, wherein the outputs of said correlators are analog signals, and wherein the logic means includes analog-to-digital conversion means to provide the phase values $r_1$ and $r_2$ as digital signals.

3. An IFM receiver according to claim 2, wherein said frequency-determining means is a memory having address input means coupled to said logic means with an address being formed from said phase values $r_1$ and $r_2$, the memory having memory locations to store a frequency value for each address.

* * * * *